(12) United States Patent
Minami et al.

(10) Patent No.: US 6,366,625 B1
(45) Date of Patent: Apr. 2, 2002

(54) CONTROL INFORMATION ASSIGNING METHOD, CONTROL METHOD, TRANSMITTING METHOD, RECEIVING METHOD, TRANSMITTER AND RECEIVER

(75) Inventors: Hideki Minami, Chiba; Tomoya Yamaura; Kazuyuki Sakoda, both of Tokyo; Mitsuhiro Suzuki, Chiba, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/204,298

(22) Filed: Dec. 3, 1998

(30) Foreign Application Priority Data

Dec. 10, 1997 (JP) .............................. 9-340416

(51) Int. Cl.$^7$ ............................................. H04L 27/06
(52) U.S. Cl. .................. 375/341; 375/130; 455/522; 370/210
(58) Field of Search ................... 455/522, 69; 375/341, 375/130; 370/335, 342, 210, 343

(56) References Cited

U.S. PATENT DOCUMENTS 5,604,766 A * 2/1997 Dohi et al. ................. 375/200
5,623,486 A * 4/1997 Dohi et al. ................. 370/342
5,822,318 A * 10/1998 Tiedemann, Jr. et al. ... 370/391

FOREIGN PATENT DOCUMENTS

| EP | 0419432 | 3/1991 | .......... H03M/13/00 |
| EP | 0683570 | 11/1995 | .......... H04B/7/005 |
| EP | 0751625 | 1/1997 | .......... H03M/13/00 |

* cited by examiner

*Primary Examiner*—Stephen Chin
*Assistant Examiner*—Shuwang Liu
(74) *Attorney, Agent, or Firm*—Jay M. Maioli (57) ABSTRACT

A control information assigning method whereby control information can be accurately transmitted. Present control information and past control information are formed into a pair to be assigned to one transmission symbol, so that a prescribed restricted condition is applied to the transmission symbol. Thereby, an error correction capability can be added to the transmission symbol and thus, the control information can be accurately transmitted.

24 Claims, 9 Drawing Sheets

CONTROL INFORMATION ASSIGNING METHOD, CONTROL METHOD, TRANSMITTING METHOD, RECEIVING METHOD, TRANSMITTER AND RECEIVER

BACKGROUND OF THE INVENTION

1. Field of the Invention

This invention relates to a control information assigning method, a control method, a transmitting method, a receiving method, a transmitter and a receiver and more particularly, suitably applied to a cellular radiocommunication system.

2. Description of the Related Art

In a cellular radiocommunication system, an area for providing a communication service has been divided into cells with a desired size and a base station as a fixed station has been provided in each of the cells so that a communication terminal device serving as a mobile station can perform a radio-communication with that base station of which a communication condition is the most preferable.

When a desired communication is carried out in this type of the cellular radiocommunication system, the communication may require high transmitting power or may be carried out even with low transmitting power, depending on the position of the mobile station. Therefore, in the cellular radiocommunication system, the base station and the communication terminal device mutually monitor their receiving power (or the quality of the receiving power) and interchangeably inform each other of the monitoring result so that a feedback loop is formed. As a result, the communication is carried out with the minimum transmitting power required, that is, a transmitting power control is performed. Accordingly, in the cellular radiocommunication system, since the communication can be efficiently achieved with the minimum transmitting power required and consumed power can be reduced as compared with a case in which communications are performed with constant power, the using time of a battery can be extended with a special effect particularly for the communication terminal device.

The cellular radiocommunication system can control the transmitting power by transmitting control information for the power control to the other party of communication, however, it does not have a method of assuredly transmitting the control information to the other party. Therefore, the system is still open for improvement.

SUMMARY OF THE INVENTION

In view of the foregoing, an object of this invention is to provide a control information assigning method capable of transmitting control information with good accuracy, a control method capable of precisely performing a control based on the control information, and a transmitting method, a receiving method, a transmitter and a receiver employing them.

The foregoing object and other objects of the invention have been achieved by the provision of a control information assigning method, control method, transmitting method, receiving method, transmitter and receiver.

In the control information assigning method for a control system for performing a prescribed control corresponding to control information by transmitting transmission symbols to which the control information is assigned from a transmitting side and receiving the transmission symbols at a receiving side, present control information and past control information are formed into a pair to be assigned to one of the transmission symbols, so that a prescribed restricted condition is applied to the transmission symbol.

Further, in the control method for a control system for performing a prescribed control corresponding to a controlled variable by transmitting transmission symbols to which the controlled variable is assigned from a transmitting side and receiving the transmission symbols at a receiving side, when the transmission symbol to which a pair of present controlled variable and past controlled variable is assigned is transmitted, the receiving side stores a cumulative controlled variable from an initial state to each symbol, decides a transmission symbol of which the branch metric sum is the minimum out of said transmission symbols received as a received symbol, and performs the control based on the cumulative controlled variable of the decided symbol.

Further, in the transmitting method for a communication system for controlling transmitting power of the local station corresponding to control information by transmitting transmission symbols to which the control information for controlling transmitting power is assigned from a transmitting side and receiving the transmission symbols at a receiving side, present control information and past control information are formed into a pair to be assigned to one of the transmission symbols, so that a prescribed restricted condition is applied to the transmission symbol and the transmission symbol, to which the restricted condition is applied, is transmitted.

Further, in the receiving method for a communication system for controlling transmitting power of the local station according to a controlled variable by transmitting transmission symbols to which the controlled variable for controlling the transmitting power is assigned, from a transmitting side and receiving the transmission symbols at a receiving side, when the transmission symbol to which a pair of the present controlled variable and the past controlled variable is assigned is transmitted a cumulative controlled variable is stored from an initial state to each symbol, a symbol of the received transmission symbols of which the branch metric sum is the minimum is decided as a received symbol, and the transmitting power of the local station is controlled based on the cumulative controlled variable of the decided symbol.

Further, the transmitter for a communication system for controlling transmitting power of the local station based on control information by transmitting transmission symbols to which the control information for controlling the transmitting power is assigned, from a transmitting side and receiving the transmission symbols at a receiving side, comprises a symbol forming means for forming present control information and past control information into a pair and assigning this pair to one of the transmission symbols so as to form a transmission symbol to which a prescribed restricted condition is added and a transmitting means for transmitting the transmission symbol to which the restricted condition is added.

Furthermore, a receiver for a communication system for controlling transmitting power of the local station based on a controlled variable by transmitting transmission symbols to which the controlled variable for controlling the transmitting power is assigned, from a transmitting side and receiving the transmission symbols at a receiving side, comprises a controlling means, when the transmission symbol to which a pair of the present controlled variable and the past controlled variable is assigned is transmitted, for storing cumulative controlled variable from an initial state to each symbol, deciding a symbol of the transmission symbols received of which the branch metric sum is the minimum as a received symbol, and forming a transmitting power control signal based on the cumulative controlled variable of the decided symbol and a variable gain means for setting the transmitting power of the local station to a desired value based on the transmitting power control signal.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of this invention will be described with reference to the accompanying drawings:
(1) First Embodiment
(1-1) Entire Constitution of Cellular Radiocommunication System FIG. 1, generally shows a cellular radiocommunication system 1 to which the present invention is applied, wherein communication is performed through a radio line with which a base station 2 is connected to a communication terminal device 3. In this case, the base station 2 has a receiving part 4, a control part 5 and a transmitting part 6. The communication terminal device 3 also has a receiving part 7, a control part 8 and a transmitting part 9. Communication between the base station 2 and the communication terminal device 3 is performed by using these circuit blocks.

Figure 1:
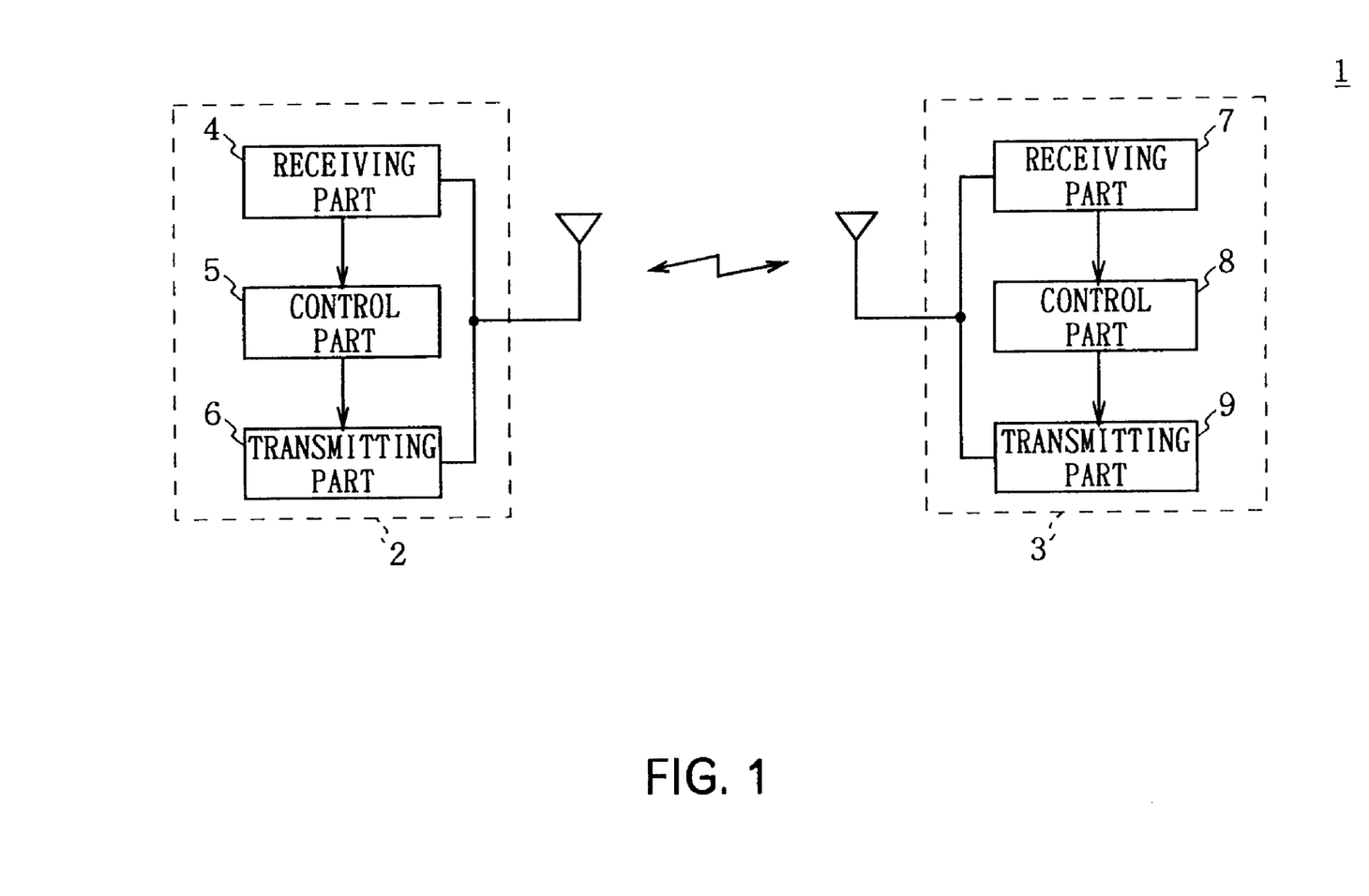
FIG. 1 is a block diagram showing the constitution of a cellular radiocommunication system to which the present invention is applied.

The receiving part 4 of the base station 2 demodulates transmission data to be sent, by receiving a transmission signal from the communication terminal device 3 and moreover, detects control data for a power control included in the transmission signal, in order to supply the detected control data to the control part 5. The receiving part 4 detects a signal-to-interference wave power ratio C/I (that is, the ratio of desired wave power to interference wave power) of the transmission signal from the communication terminal device 3 and also supplies the detected signal-to-interference wave power ratio C/I to the control part 5.

The control part 5 generates a power control signal for controlling the transmitting power of the local station based on the control data supplied from the receiving part 4, and sends it to the transmitting part 6. Further, the control part 5 generates control data for controlling the transmitting power of the communication terminal device 3 based on the signal-to-interference wave power ratio C/I supplied from the receiving part 4, and sends it to the transmitting part 6. The transmitting part 6 controls the transmitting power of the local station based on the power control signal received from the control part 5 and moreover, inserts the control data received from the control part 5 into the transmission data to generate a transmission signal and transmits it to the communication terminal device 3.

Similarly, the receiving part 7 of the communication terminal device 3 receives a transmission signal from the base station 2 to demodulate transmission data to be sent, detects control data for a power control included in the transmission signal and supplies the detected control data to the control part 8. Further, the receiving part 7 detects a signal-to-interference wave power ratio C/I of the transmission signal from the base station 2 and supplies the detected signal-to-interference wave power ratio C/I to the control part 8.

The control part 8 generates a power control signal for controlling the transmitting power of the local station based on the control data from the receiving part 7, and transmits it to the transmitting part 9. Further, the control part 8 generates control data for controlling transmitting power of the base station 2 based on the signal-to-interference wave power ratio C/I and supplies it to the transmitting part 9. The transmitting part 9 controls the transmitting power of the local station based on the power control signal supplied from the control part 8 and moreover, inserts the control data received from the control part 8 into the transmission data to generate a transmission signal and sends it to the base station 2.

In this way, in the cellular radiocommunication system 1, the base station 2 and the communication terminal device 3 mutually detect the signal-to-interference wave power ratio C/I of the transmission signal received from the other party and inform the other party of the control data for the transmitting power corresponding to the detected result so as to control the transmitting power.

(1-2) Constitution of Receiving Part, Control Part and Transmitting Part

Now, in this section, the receiving parts 4 and 7, the control parts 5 and 8 and the transmitting parts 6 and 9, which are provided in the base station 2 and the communication terminal device 3 respectively, will be described in detail. However, since the base station 2 and the communication terminal device 3 have the same circuit constitution, the receiving part 7, the control part 8 and the transmitting part 9 of the communication terminal device 3 will be described in this section.

Figure 2:
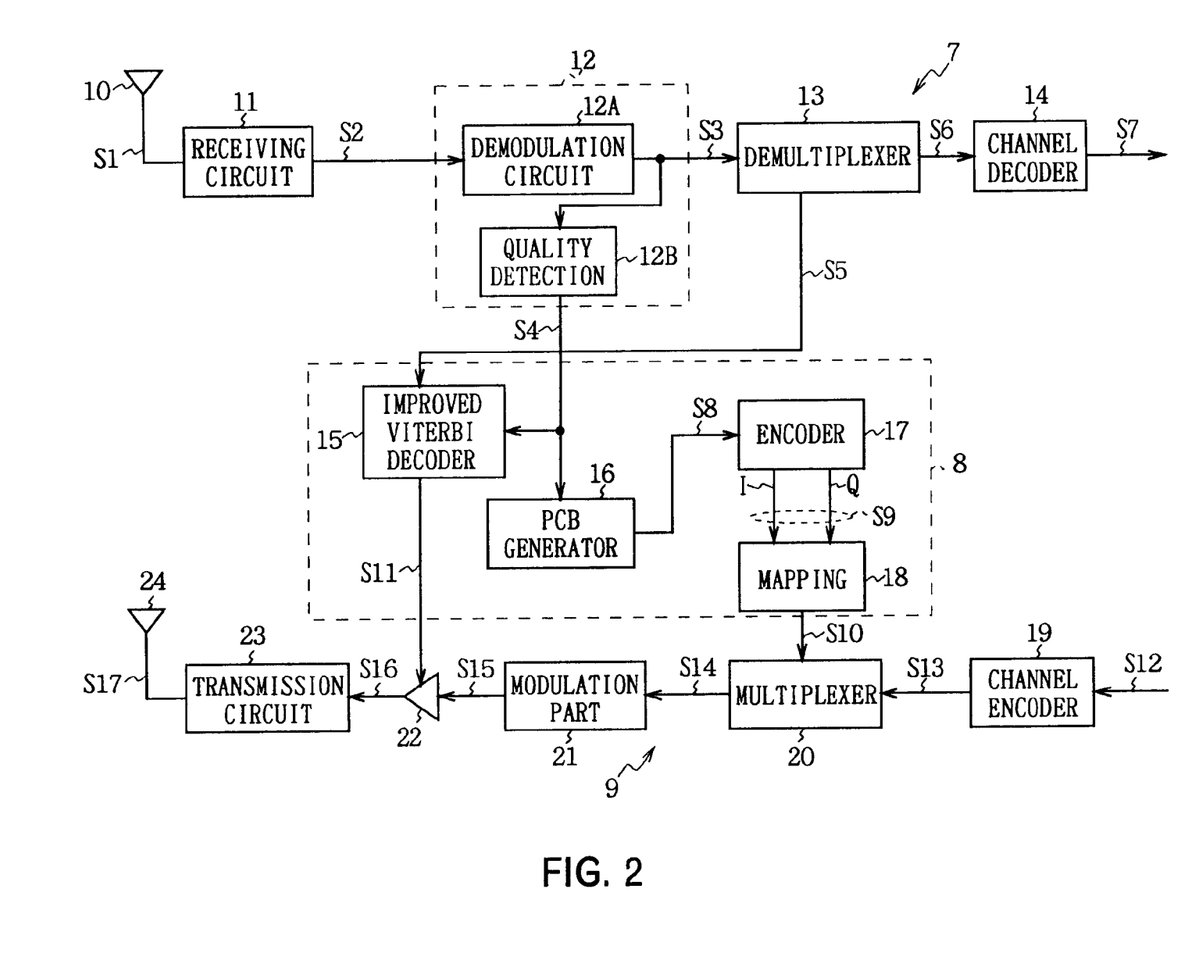
FIG. 2 is a block diagram showing the constitutions of a receiving part, a control part and a transmitting part.

As shown in FIG. 2, in the receiving part 7, a received signal S1 received by an antenna 10 is inputted to a receiving circuit 11 where a baseband signal S2 is taken out from the received signal S1 and inputted to a demodulation part 12. The demodulation part 12 has a demodulation circuit 12A and a quality detection circuit 12B therein to input the baseband signal S2 to the demodulation circuit 12A. The demodulation circuit 12A generates a reception symbol S3 from the baseband signal S2 and outputs it to a demultiplexer 13 and the quality detection circuit 12B.

The quality detection circuit 12B detects the signal-to-interference wave power ratio C/I of the received signal based on the reception symbol S3 supplied and outputs detection data S4 indicating the detected signal-to-interference wave power ratio C/I to the control part 8. The demultiplexer 13 extracts a control symbol S5 concerning a power control from the supplied reception symbol S3 and outputs the control symbol S5 to the control part 8. Further, the demultiplexer 13 outputs a reception symbol S6 which remains as a result after extracting the control symbol S5, to a channel decoder 14. The channel decoder 14 applies a symbol demodulation process to the reception symbol S6 to restore a receiving data bit S7 from the reception symbol S6 and outputs it to a latter stage of a sound processing circuit (not shown).

In the control part 8, the detection data S4 supplied from the receiving part 7 is inputted to an improved viterbi decoder 15 and a power control bit generator (hereinafter, referred to as a PCB generator) 16, and the control symbol S5 supplied from the receiving part 7 is inputted to the improved viterbi decoder 15.

The PCB generator 16 generates a power control bit S8 indicating the controlled variable of the transmitting power of the base station side based on the signal-to-interference wave power ratio C/I indicated by the detection data S4, and outputs it to an encoder 17. In this connection, the power control bit S8 is bit information showing an instruction for raising or lowering the transmitting power of the base station side. For example, bit "0" is bit information which indicates that the transmitting power is raised by 1 [dB] and bit "1" is bit information which indicates the transmitting power is lowered by 1[dB]. Further, the PCB generator 16 generates such a power control bit S8 as to raise the transmitting power when the signal-to-interference wave power ratio C/I is lower than a prescribed threshold value, and generates such a power control bit S8 as to lower the transmitting power when the signal-to-interference wave power ratio C/I is higher than the prescribed threshold value.

The encoder 17 generates control data S9 composed of I data and Q data based on the supplied power control bit S8 and outputs it to a mapping circuit 18. The mapping circuit 18 generates a control symbol S10 for controlling transmitting power of the base station, based on the I data and the Q data of the control data S9 and outputs it to the transmitting part 9.

The improved viterbi decoder 15 multiplies the control symbol S5 supplied from the receiving part 7 by the signal-to-interference wave power ratio C/I represented by the detection data S4, so that the quality of a transmission path is reflected on the control symbol S5. Then the improved viterbi decoder 15 applies an improved viterbi algorithm described later to the resultant control symbol to detect the controlled variable of the transmitting power, generates a power control signal S11 corresponding to the controlled variable and outputs it to the transmitting part 9.

In the transmitting part 9, a transmission data bit S12 to be transmitted which is supplied from the sound processing circuit (not shown) is first inputted to a channel encoder 19 which applies a prescribed encoding process to the bit S12 to generate a transmission symbol S13. A multiplexer 20 receives the control symbol S10 from the control part 8 as well as the transmission symbol S13 from the channel encoder 19, and inserts the control symbol S10 into the prescribed position of the transmission symbol S13 to generate a transmission symbol S14.

A modulation part 21 applies a predetermined modulation process to the transmission symbol S14 to generate a transmission signal S15 and outputs it to a variable gain amplifier 22. The variable gain amplifier 22, receiving the power control signal S11 from the control part 8, amplifies the transmission signal S15 by a gain value based on the power control signal S11, in order to generate a transmission signal S16 of the transmitting power instructed by the base station 2. A transmission circuit 23 applies a predetermined high frequency process such as a frequency conversion to the transmission signal S16 to generate a transmission signal S17 and transmits the transmission signal S17 through an antenna 24.

(1-3) Method of Generating Control Symbol by Encoder and Mapping Circuit

Subsequently, a method of generating the control symbol S10 by the encoder 17 and the mapping circuit 18 will be described in this section. In this embodiment, quadrature phase shift keying (QPSK), four phase modulation, is used as a modulation mode and information for indicating that the transmitting power is raised or lowered is used as information for a power control as mentioned above. As described above, the bit "0" indicates that the transmitting power is raised by 1[dB] and the bit "1" indicates that the transmitting power is lowered by 1[dB].

Figure 3:
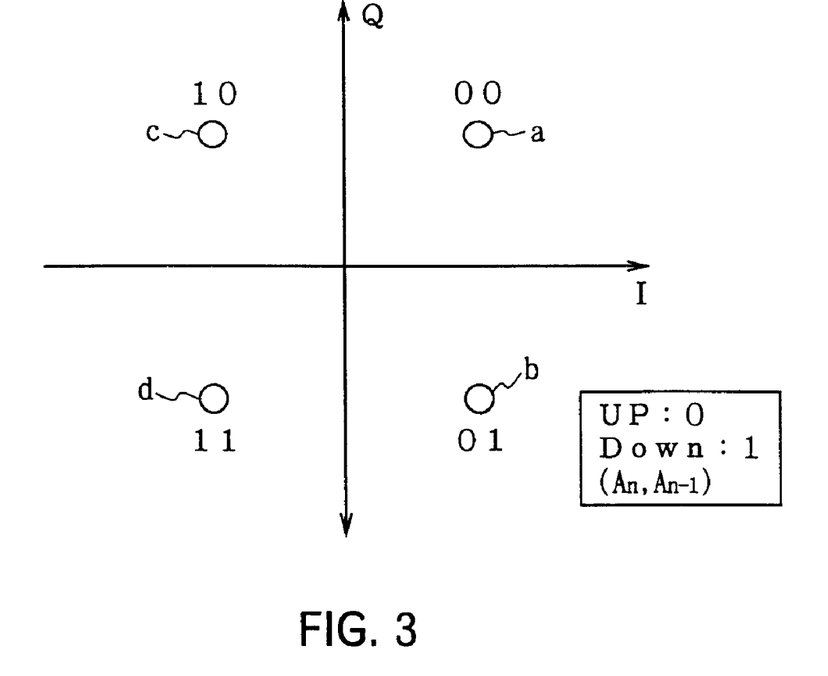
FIG. 3 is a signal arrangement diagram showing a mapping method for a control symbol to QPSK symbols.

The encoder 17 considers the value $A_{n-1}$ of a power control bit S8 one before a power control bit S8 inputted thereto as Q data and the value $A_n$ of the power control bit S8 inputted this time as I data, based on the inputted control bit S8, generates control data S9 in which the I and Q data is expressed by $(A_n, A_{n-1})$ and outputs the control data S9 to the mapping circuit 18. The mapping circuit 18 assigns the control data S9 to a corresponding symbol of the symbols in the QPSK mode having a symbol arrangement in which symbols are arranged at intervals of $\pi/2$ as shown in FIG. 3. In other words, if the control data S9 is (0, 0), it is assigned to a symbol a located in a first quadrant. If the control data S9 is (0,1), it is assigned to a symbol b located in a fourth quadrant. If the control data S9 is (1,0), it is assigned to a symbol c located in a second quadrant. If the control data S9 is (1, 1), it is assigned to a symbol d located in a third quadrant.

As in the assignment of symbols, the control data S9 of which contents are quite opposite to each other, (for instance, the control data in which both the values of previous time and this time are "0" and the control data in which both the values of previous time and this time are "1") are arranged at symmetric positions relative to an origin on an IQ plane. Therefore, with the contents of the data being quite opposite to each other, the Euclid distance between symbols is the maximum. Consequently, even when the control data receives an influence of a noise or interference wave on a transmission path, the control data can be prevented from changing to data whose contents are quite opposite to the former and transmission quality of the control symbol S10 can be improved.

Further, the present power control bit S8 $(=A_n)$ and the power control bit S8 $(=A_{n-1})$ one before the present control bit are formed into a pair to be assigned to one of symbol information, so that a prescribed restricted condition is applied to the control symbol S10 for a power control. If the restricted condition is applied to the control symbol S10 in such a way, the control symbol S10 can have an error correcting capacity as if a pseudo convolutional encoding process were performed.

Figure 4:
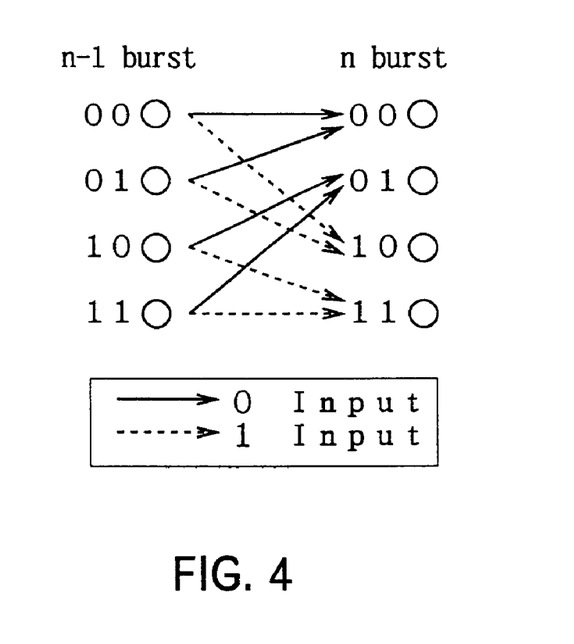
FIG. 4 is a state transition diagram explaining the state transition of the control symbol.

Here, an explanation will be given to this point by employing FIG. 4. The power control bit of the previous time and the power control bit of this time are formed into a pair and assigned to one of symbol information. In this case, if (0, 0) is received as a (n−1)th control symbol S10, a possible value as a next nth control symbol S10 is either (0, 0) or (1, 0) because the power control bit of the previous time is "0" and other values are impossible. Similarly, if (0, 1) is received as a (n−1)th control symbol S10, a possible value as a next nth control symbol S10 is either (0,0) or (1,0) because the power control bit of the previous time is "0". When the symbol assignment is performed by forming the power control bit of the previous time and the power control bit of this time into a pair in such a manner, a certain kind of restricted condition can be given to the control symbol because there are actually two available symbols, although four kinds of symbols exist. Accordingly, when the received control symbol S10 is contrary to the restricted condition, the control symbol S10 is regarded as erroneous so that it is possible to perform an error correction.

(1-4) Constitution of Encoder

Figure 5:
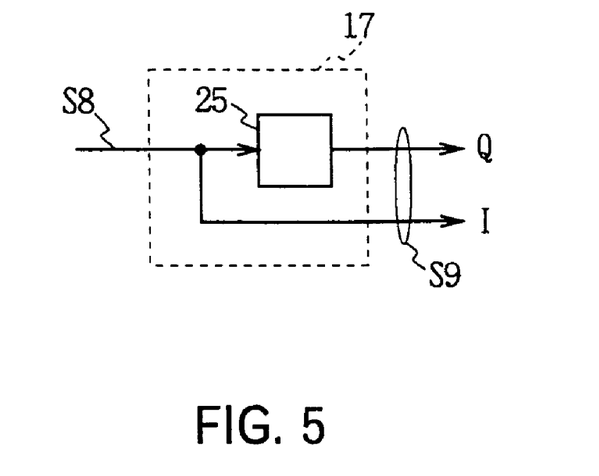
FIG. 5 is a block diagram showing the constitution of an encoder.

Subsequently, the encoder 17 which generates the control data S9 from the power control bit S8 will be described in this section. As illustrated in FIG. 5, the encoder 17 is constituted of a one-stage shift register 25, in order to input the inputted power control bit S8 to the shift register 25 and output the power control bit S8 as it is as I data. The shift register 25 delays and outputs the inputted power control bit S8 by one burst. Thus, in the encoder 17, the control data S9 is generated by forming a pair of the power control bit S8 of this time and the power control bit S8 one before the power control bit of this time.

(1-5) Decoding Process of Improved Viterbi Decoder

Figure 6:
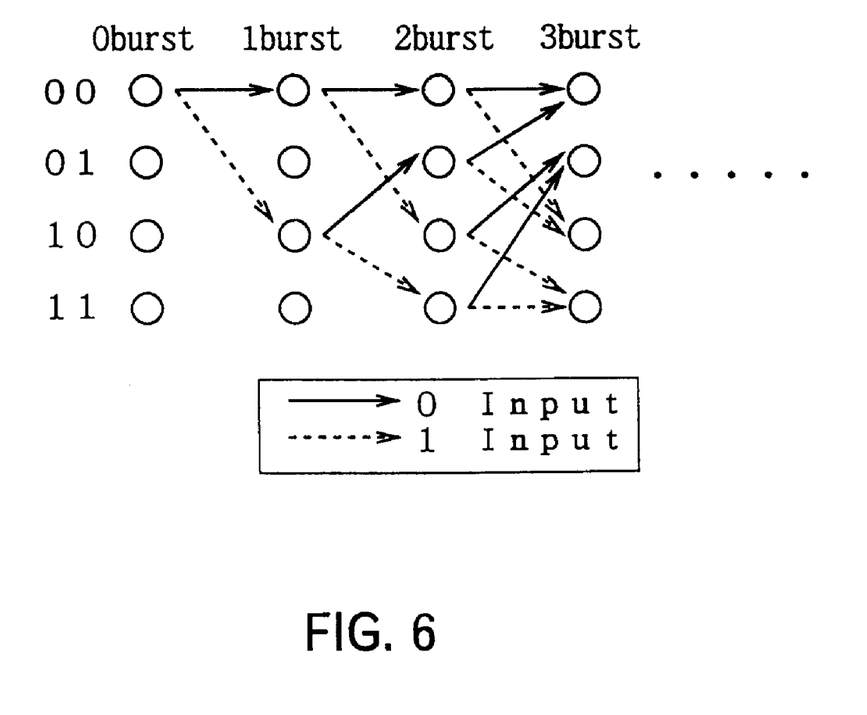
FIG. 6 is a trellis diagram explaining a decoding algorithm of the control symbol.

Next, a decoding method of the control symbol S5 in the improved viterbi decoder 15 will be described in this section. The control symbol S5 formed by a mapping method shown in FIG. 3 in the base station 2 can achieve a state transition as shown in FIG. 4, so that it can be decoded in accordance with a viterbi algorithm employing a trellis diagram shown in FIG. 6. In FIG. 6, a first sent control symbol S5, in other words, an initial state is set to (0, 0).

In the case of using the trellis diagram to decode, the decoding process can be performed by considering the branch metric in each of the state transitions (that is, the reliability of the state transition). Generally, assuming that a nth control symbol S5 varies from a state $S_K$ to a state $S_1$, the branch metric $BR_n(S_K, S_1)$ at that time is expressed by the square of the difference between an actually received control symbol and a candidate symbol as shown by the following expression (1).

$$BR_n(S_k, S_l)=(Y_n-X_j)^2 (k,l=\{0, 1, 2, 3\})\ (j=\{0, 1\}) \quad (1)$$

In the expression (1), $Y_n$ represents an actually received nth (nth burst) control symbol and $X_j$ represents a candidate symbol. Further, k, l indicate the respective states and j shows the classification of the candidate symbols. In this case, since the modulation mode is QPSK, the number of available states is four. The number of available candidate symbols is two due to the restricted condition as described above.

As mentioned above, in the improved viterbi decoder 15, the signal-to-interference wave power ratio C/I detected by the receiving part 7 is reflected on the control symbol S5 as the reliability information of symbols. The branch metric $BR_n(S_K, S_1)$ at the time when the signal-to-interference wave power ratio C/I is reflected on the control signal S5 in such a manner is obtained by multiplying the signal-to-interference wave power ratio C/I by the expression (1) as expressed in the following expression (2).

$$BR_n(S_k, S_l)=C/I(Y_n-X_j)^2 (k, l=\{0,1,2,3\})\ (j=\{0,1\}) \quad (2)$$

In this case, assuming that a nth control symbol S5 is in a state $S_m$, the branch metric sum $\sigma_{Sm}$ united with the state $S_m$ may be obtained by adding the respective branch metrics together, and therefore, it can be expressed as shown by the following expression (3).

$$\sigma_{Sm} = \sum_{i=1}^{n} BR_i(S_k, S_l) \quad (3)$$

$$(k, l = \{0, 1, 2, 3\})$$

$$(m = \{0, 1, 2, 3\})$$

This branch metric sum $\sigma_{Sm}$ shows the reliability in the state $S_m$ (since the branch metric is calculated based on the difference between the actually received control symbol and the candidate symbol, the branch metric sum $\sigma_{Sm}$ with a minimum value is high in its reliability). Therefore, when the control symbol is restored, the branch metric sums $\sigma_{Sm}$ in the respective states are compared therebetween and a symbol with the minimum value of the branch metric sum is chosen as a received control symbol, so that the control symbol can be easily decoded.

In this connection, the viterbi algorithm used by an ordinary viterbi decoder or the like brings paths into convergence by inserting a known symbol into symbols in order to select one of the paths, each of which exists in each state, at the final stage. The improved viterbi decoder 15 chooses the received control symbol by selecting the state in which the branch metric sum $\sigma_{Sm}$ is the minimum, and does not bring paths into convergence particularly. Therefore, the characteristic of the improved viterbi decoder 15 is slightly deteriorated as compared with the viterbi algorithm of the ordinary viterbi decoder. However, at least in order to choose the control symbol, an optimum symbol of which the branch metric sum $\sigma_{Sm}$ is the minimum is selected in the improved viterbi decoder 15, the decision itself of the control symbol being equal to that of the ordinary viterbi decoder. Further, since the improved viterbi decoder does not bring paths into convergence as in the case of the ordinary viterbi decoder, the more optimum symbol can be rapidly chosen. Thus, the improved viterbi decoder is the most suitable for a system for controlling transmitting power for each burst.

Further, since the viterbi algorithm employed by the ordinary viterbi decoder or the like decodes encoded data sequences themselves, the number of optimum paths existing in each of the states, which corresponds to the number of the sequences, needs to be stored. However, the viterbi algorithm according to the improved viterbi decoder 15 selects only one optimum path. Therefore, it is not necessary to store all the optimum paths each of which exists in each of the states. Here, an important thing for a power control is not control information on how transmitting power reaches the states but information on how much the transmitting power is changed from the initial state. In this instance, since the information represented by the path only indicates that the transmitting power is increased or decreased, the sum of the 0th to nth burst paths, that is, a cumulative controlled variable is important for the nth burst control symbol. Therefore, in the improved viterbi decoder 15, a circuit can be formed with a very small path memory as compared with the viterbi algorithm employed in the ordinary viterbi decoder.

Thus, the improved viterbi decoder 15 obtains the branch metric sum $\sigma_{Sm}$ expressed by the aforementioned expression (3) every time the control symbol S5 is inputted and moreover, obtains the cumulative controlled variable as the sum of the respective paths. Then, the improved viterbi decoder 15 selects a symbol of which the branch metric sum $\sigma_{Sm}$ is the minimum, selects the cumulative controlled variable of the symbol, and outputs a power control signal S11 corresponding to the selected cumulative controlled value.

Figure 7:
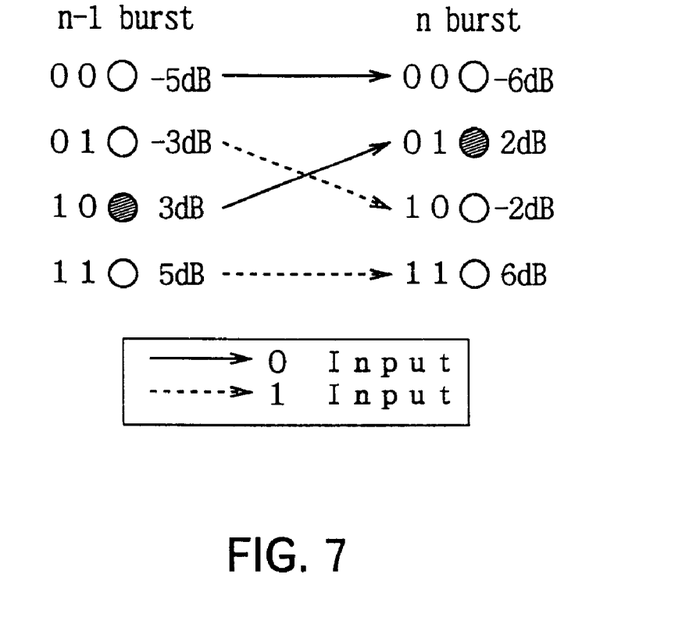
FIGS. 7 and 8 are state transition diagrams explaining examples for decoding the control symbol.

Now, an example of the operation of the improved viterbi decoder 15 is illustrated in FIG. 7. At first, since the branch metric sum $\sigma_{Sm}$ of the symbol (1,0) is the minimum in a (n−1) th burst, it is assumed that the cumulative controlled variable (=3 [db]) to a symbol (1, 0) is selected to perform a power control based on the value. Under this state, assuming that the branch metric sum $\sigma_{Sm}$ of a symbol (0, 1) is the minimum in a next nth burst, the cumulative controlled variable (=2 [dB]) to the symbol (0, 1) is selected and the power control signal S11 adjusts the transmitting power by the difference between the cumulative controlled variable (=3 [dB]) of the previous time and the cumulative controlled variable (=2 [dB]) of this time, that is, −1 [dB] is generated to control the transmitting power.

Figure 8:
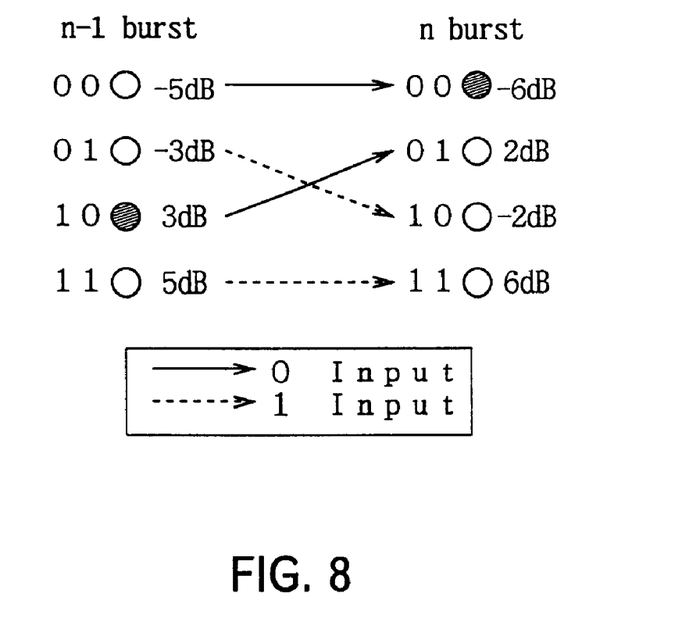

As compared therewith, as illustrated in FIG. 8, assuming that the branch metric sum $\sigma_{Sm}$ of a symbol (0, 0) is the minimum in the nth burst, the symbol (0, 0) is selected based on the branch metric sum $\sigma_{Sm}$ giving the branch metric sum $_{Sm}$ priority, though it is not suitable for the restricted condition of the symbol. Then, the power control signal S11 adjusts the transmitting power by the difference between the cumulative controlled variable (=−6 [dB]) of the selected symbol (0,0) and the cumulative controlled variable (=3 [dB]) of the previous time, that is, −9 [dB], is generated to control the transmitting power. In such a way, the transmitting power is controlled every time by the difference between the cumulative controlled variable selected at this time and the cumulative controlled variable selected at the previous time, so that even in case the selection of the previous time is erroneous, the error can be corrected and the transmitting power can be accurately controlled.

Therefore, the improved viterbi decoder 15 selects a symbol of which branch metric sum $\sigma_{Sm}$ is the minimum in order to control the transmitting power based on the cumulative controlled variable of the selected symbol, so that the power control can be performed by a control symbol with the highest transmission probability and a highly accurate power control can be achieved.

According to the decoding algorithm of the improved viterbi decoder 15, when the number n of burst is small, the branch metric sum $\sigma_{Sm}$ becomes small, so that the control symbol is liable to receive the influence of noise. Further, even when the signal-to-interference wave power ratio C/I is reflected on the control symbol, a similar phenomenon may occur if the number n of burst is small. As a result, when the number n of bursts is small, a symbol which is not suitable for the restricted condition of the control symbol may often be selected.

A problem is the case where a symbol which is not suitable for the restricted condition of the control symbol is selected, which often occurs when the controlled variable of the transmitting power is increased. For instance, it is assumed that a symbol incompatible with the restricted condition of the control symbol is selected. If the selected symbol was erroneous, the transmitting power would be controlled with a relatively large controlled variable. Such a condition particularly does not have a problem to lower the transmitting power with the relatively large controlled variable. However, on the contrary, when the transmitting power is raised with the relatively large controlled variable, the influence of interference wave is applied to other radio communications, so that the aforementioned condition is not preferable for the radiocommunication system.

Figure 9:
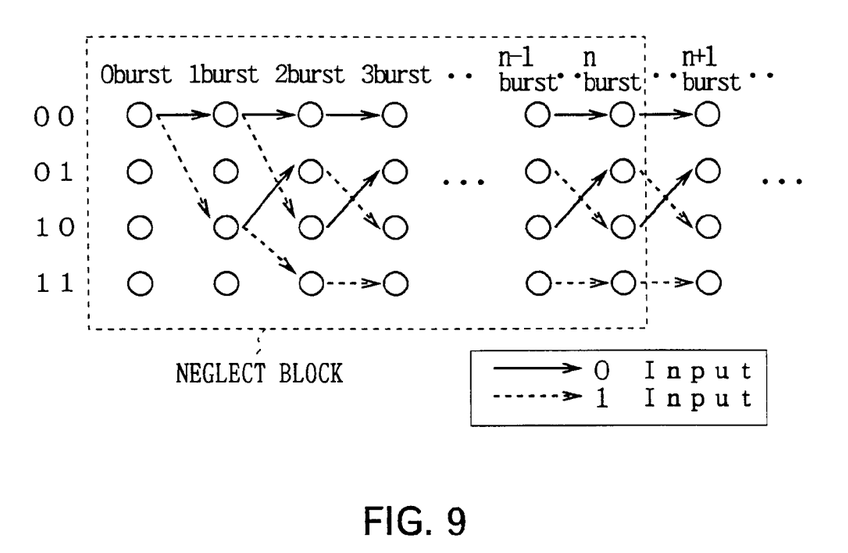
FIG. 9 is a state transition diagram explaining an example for decoding the control symbol when an initial burst is neglected.

For this reason, in the improved viterbi decoder 15, as shown in FIG. 9, the decoding algorithm is simply operated in order to stabilize the algorithm for the initial several bursts (0 to n bursts in an example shown in FIG. 9) and the transmitting power is not controlled (that is to say, the power control signal S11 is not outputted), and the power control signal S11 is generated based on a controlled variable decoded by bursts subsequent thereto (in the example shown in FIG. 9, bursts after (n+1)th burst) to control the transmitting power. Thus, in the improved viterbi decoder 15, an instability recognized when the number of bursts is small can be dissolved so that the decoding algorithm can be stably operated to accurately control the transmitting power.

Further, if the signal-to-interference wave power ratio C/I is restored to a good condition after its deterioration continues for several bursts, a control symbol incompatible with the restricted condition of the control symbol after the signal-to-interference wave power ratio C/I becomes desirable may be possibly selected. In such a case, a controlled variable is apt to be relatively high. In this case, when the received control symbol has no error, a special problem does not arise. However, the case where the received control symbol is wrong and the decoded controlled variable increases the transmitting power, has a problem in which the decoded controlled variable influences other radio communications as 94 interference wave.

Figure 10:
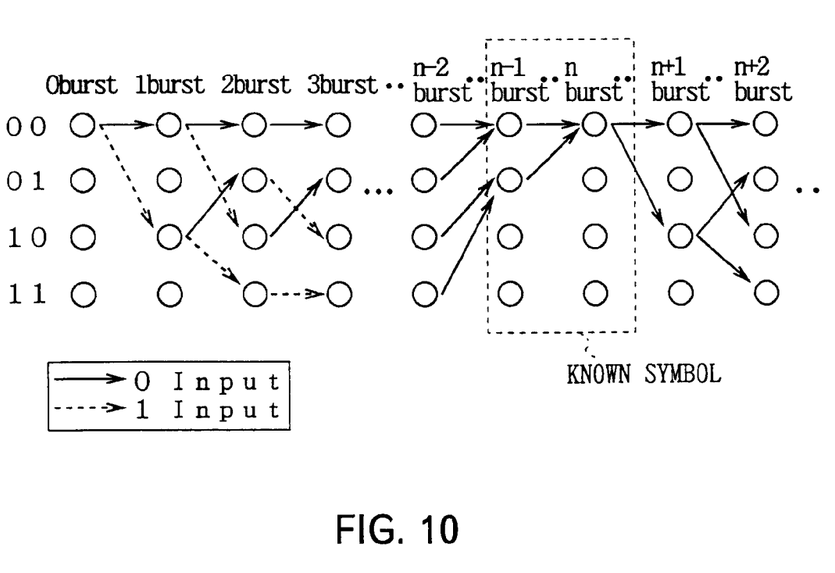
FIG. 10 is a state transition diagram explaining an example for decoding the control symbol when known symbols are inserted.

For overcoming this problem, as shown in FIG. 10, the mapping circuit 18 of the transmitting side inserts a known symbol into the control symbol S10 for each burst to transmit the resultant control symbol S10. The improved viterbi decoder 15 of the receiving side brings the decoding algorithm of the control symbol into convergence based on the known symbol, so that the controlled variable of the transmitting power is prevented from increasing. In this case, since the control symbol represents the controlled variable of a burst one before a present burst and the controlled variable of the present burst, the known symbol is transmitted by two bursts, so that the decoding algorithm can be converged as illustrated in FIG. 10. In this connection, in the example shown in FIG. 10, the known controlled variable "0" is used by the (n−1) burst and the known controlled value "0" is used by the n burst, so that the decoding algorithm can be converged to (0, 0).

As described above, the transmitting side inserts the known symbols into the control symbols S10 to transmit it and the receiving side brings the decoding algorithm into convergence based on the known symbols. Therefore, an erroneous decoding algorithm such as the excessive increase of the transmitting power can be avoided and the obstruction of 94 interference wave to other radio communications can be avoided.

(1-6) Operation and Effects

In the cellular radiocommunication system 1 with the aforementioned constitution, the signal-to-interference wave power control ratio C/I of the transmission signal from the other party is detected mutually between the base station 2 and the communication terminal device 3, and the controlled variable of the transmitting power is determined based on the detected signal-to-interference wave power ratio C/I to be transmitted to the other party, in order to control the transmitting power. When informing the other party of the controlled variable, the controlled variable one before that of this time and the controlled variable of this time are formed into one pair to a be assigned to corresponding symbol of four symbols of QPSK. Since the controlled variable one before that of this time and the controlled variable of this time are assigned to one symbol, the restricted condition can be added to the control symbol S10 of transmitting the controlled variable of the transmitting power.

In this connection, if the restricted condition is added to the control symbol S10, an error correcting capacity can be given to the control symbol S10 as if a pseudo convolutional computation encoding process were carried out. Further, when the present controlled variable and the past controlled variable are assigned to a symbol, their controlled variables which are quite opposite to each other, are assigned to a symbol in which the Euclid distance is the maximum in a symbol constellation. Therefore, even if the influence of noise or 94 interference wave occurs on a transmission path, the controlled variable can be prevented from changing to information completely opposite thereto and the transmission quality of the control symbol S10 can be improved.

In the receiving side for receiving the control symbol S10, the signal-to-interference wave power ratio C/I initially applies to the received control symbol S5 so that the control signal S5 is reflected by reliability of the transmission path. Then, based on the control symbol S5 on which the reliability of the transmission path is reflected, the branch metric sum $\sigma_{S_m}$ is calculated every state which can be taken as a symbol, the symbol with the minimum branch metric sum $\sigma_{S_m}$ is decided as a received control symbol and the power control symbol S11 based on the cumulative controlled variable of the control symbol is generated to control the transmitting power. In this case, since the symbol with the highest probability can be selected by selecting the symbol with the minimum branch metric sum $\sigma_{S_m}$, the correct control symbol can be readily decoded. Further, in this case, since the path itself is not stored as in the ordinary viterbi algorithm but only the cumulative controlled variable is stored from the initial state, the capacity of a memory can be reduced and the constitution of the improved viterbi decoder 15 can be simplified.

According to the aforementioned constitution, when the control symbol S10 indicating the controlled variable of the transmitting power is generated, the present controlled variable and the past controlled variable are formed into a pair to be assigned to one symbol, so that the restricted condition can be applied to the control symbol S10 and the transmission quality of the control symbol S10 can be improved.

Further, the receiving side calculates the branch metric sum $\sigma_{S_m}$ based on the received control symbol S5 and decodes a symbol of which the branch metric sum $\sigma_{S_m}$ is the minimum as a received control symbol, in order to control the transmitting power based on the cumulative controlled value of the control symbol thus decided. Therefore, the transmitted control symbol can be correctly decoded, so that the transmitting power can be accurately controlled.

(2) Other Embodiments

Figure 11:
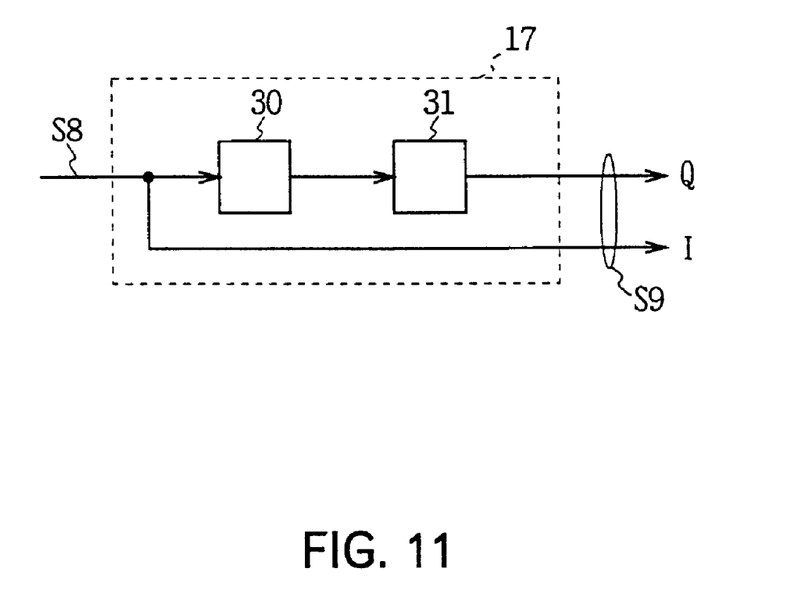
FIG. 11 is a block diagram showing the constitution of an encoder according to another embodiment.

According to the aforementioned embodiment, the present controlled variable and the controlled variable immediately preceding the present controlled variable are formed into a pair to be assigned to one symbol. However, the present invention is not limited thereto but the present controlled variable and a controlled variable two before the present controlled variable can be formed into one pair to be assigned to one symbol. In this case, as illustrated in FIG. 11, the encoder 17 can be composed of two shift registers 30 and 31. That is, the power control bit S8 supplied from the PCB generator 16 is outputted as I data as it is and the power control bit S8 is inputted to the first stage of the shift register 30. The shift register 30 delays the power control bit S8 by one burst and outputs it to the second stage of the shift register 31. The shift register 31 also delays and outputs the inputted power control bit S8 by one burst in a similar way. Thus, control data S9 having a pair of the present controlled variable and the controlled variable two bursts before the present controlled variable can be formed to be inputted to the mapping circuit 18, so that a control symbol S10 having a pair of the present controlled variable and the controlled variable two before the present controlled variable can be formed.

In this connection, in the case where the controlled variable two before the present controlled variable is used for forming the pair, a restricted condition is added to the controlled variable two before the present controlled variable. Accordingly, the generated control symbol S10 has an error correcting capacity to the controlled variable two before the present controlled variable. In order to provide the error correcting capacity for the controlled variable, the number of burst before the present controlled variable can be selected by taking the condition or characteristic of a transmission path into consideration.

Further, in the aforementioned embodiment, the present controlled variable and the past controlled variable are simply formed into a pair. However, the present invention is not limited thereto but a convolutional computation can be performed by the present controlled variable and the past controlled variable to assign the resultant control data S9 to the symbol. Such a convolutional computation adds a more effective restricted condition, so that a higher error correcting capacity can be added.

Figure 12A:
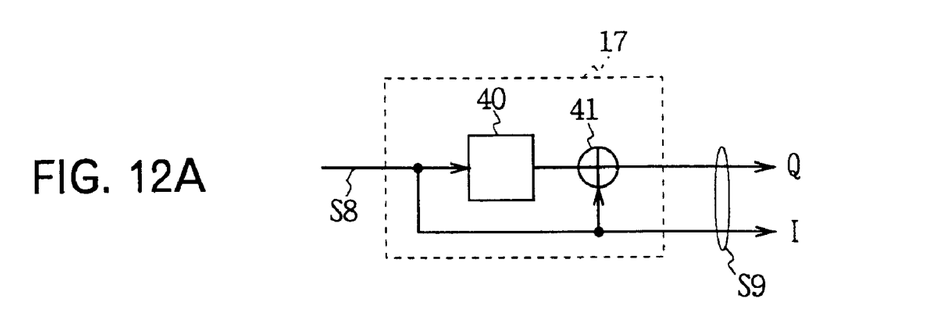
FIGS. 12A to 12C and 13A to 13F are block diagrams showing the constitutions of the encoder using a convolutional computation.
Figure 12B:
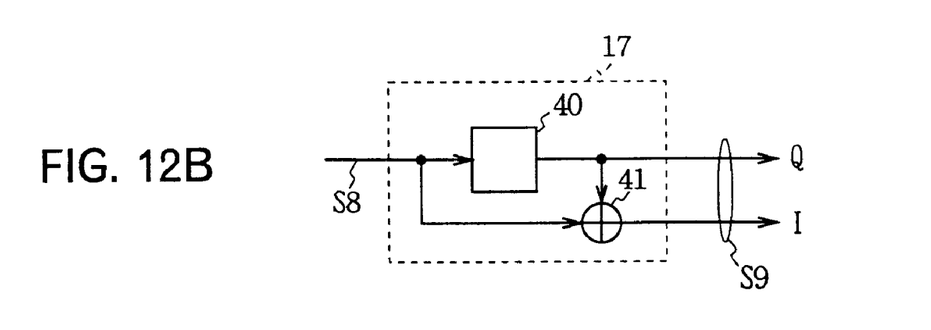
Figure 12C:
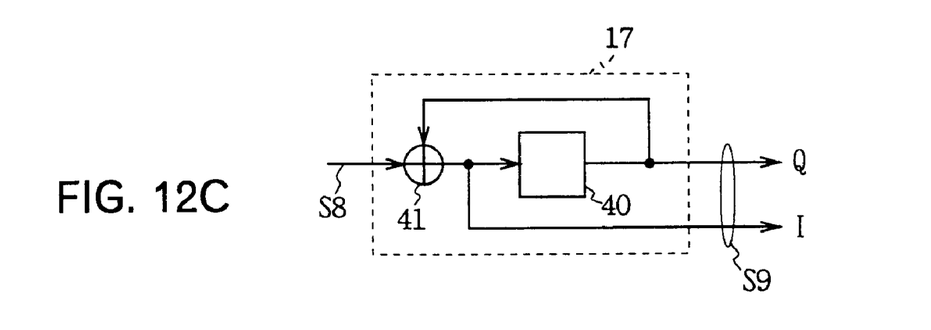

Here, the constitutions of the encoder 17 to which the convolutional computation is applied are shown in FIGS. 12A to 12C and 13A to 13F. At first, the constitutions shown in FIGS. 12A to 12C are examples showing that the convolutional computation is carried out based on the present controlled variable and the controlled variable one before the present controlled variable. In the constitution shown in FIG. 12A, the present controlled variable and the controlled variable one before the present variable outputted from a shift register 40 undergo an exclusive OR operation by a logical circuit 41 to carry out the convolutional computation, and the resultant controlled variable is outputted as Q data and the present controlled variable is outputted as I data. Further, in the constitution illustrated in FIG. 12B, the present controlled variable and the controlled variable one before the present variable outputted from the shift register 40 undergo the exclusive OR operation by the logical circuit 41 to carry out the convolutional computation, and the resultant controlled variable is outputted as I data and the controlled variable one before the present controlled variable is outputted as Q data. Furthermore, in the constitution illustrated in FIG. 12C, the present controlled variable and the controlled variable outputted from the shift register 40 undergo the exclusive OR operation by the logical circuit 41 to carry out the convolutional computation, and the resultant controlled variable is outputted through the shift register 40 as Q data and a controlled variable obtained as a result of the convolutional computation is directly outputted as I data, so as to form the result of the present convolutional computation and the result of convolutional computation one before the present result into a pair.

On the other hand, the constitutions shown in FIGS. 13A to 13F are examples showing that the convolutional computation is carried out based on a controlled variable two before the present controlled variable. In the constitution shown in FIG. 13A, a controlled variable one before the present controlled variable outputted from a first shift register 42 and the controlled variable two before the present variable outputted from a second shift register 43 undergo an exclusive OR operation by a logical circuit 44 to carry out the convolutional computation, and the resultant controlled variable is outputted as Q data and the present controlled variable is outputted as I data. Further, in the constitution illustrated in FIG. 13B, the controlled variable two before the present controlled variable outputted from the second shift register 43 and the present controlled variable undergo the exclusive OR operation by the logical circuit 44 to carry out the convolutional computation, and the resultant controlled variable is outputted as Q data and the present controlled variable is directly outputted as I data. Furthermore, in the constitution illustrated in FIG. 13C, the present controlled variable and the controlled variables one before and two before the present controlled variable outputted from the first and second shift registers 42 and 43 undergo the exclusive OR operation by the logical circuit 44 to carry out the convolutional computation, and the resultant controlled variable is outputted as Q data and the present controlled variable is directly outputted as I data.

Figure 13A:
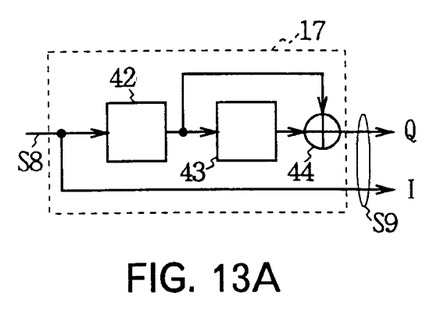
Figure 13B:
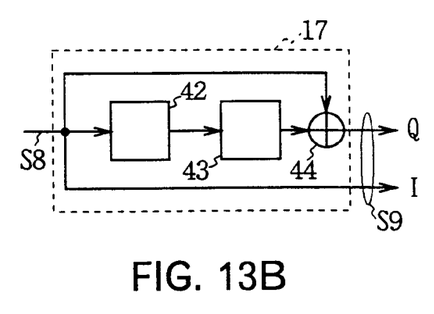
Figure 13C:
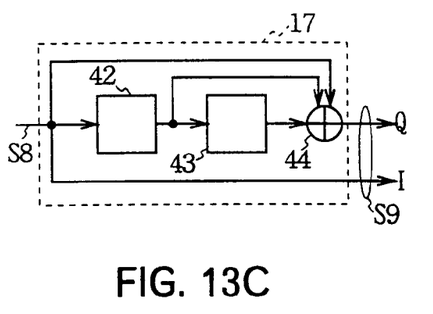
Figure 13D:
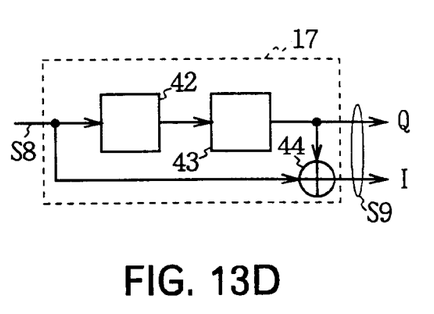
Figure 13E:
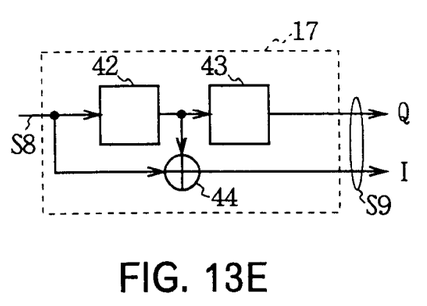
Figure 13F:
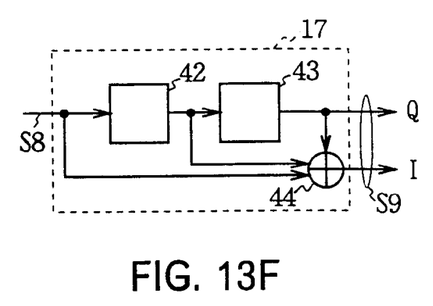

In addition, in the constitution shown in FIG. 13D, the present controlled variable and the controlled variable two before the present controlled variable outputted from the second shift register 43 undergo the exclusive OR operation by the logical circuit 44 to carry out the convolutional computation, and the resultant controlled variable is outputted as I data and the controlled variable two before the present controlled variable is outputted as Q data. Further, in the constitution illustrated in FIG. 13E, the present controlled variable and the controlled variable one before the present controlled variable outputted from the first shift register 42 undergo the exclusive OR operation by the logical circuit 44 to carry out the convolutional computation, and the resultant controlled variable is outputted as I data and the controlled variable two before the present controlled variable, which is outputted from the second shift register 43, is outputted as Q data. Furthermore, in the constitution illustrated in FIG. 13F, the present controlled variable and the controlled variables one before and two before the present controlled variable outputted from the first and second shift registers 42 and 43 undergo the exclusive OR operation by the logical circuit 44 to carry out the convolutional computation, and the resultant controlled variable is outputted as I data and the controlled variable two before the present controlled variable, which is outputted from the second shift register 43, is directly outputted as Q data. In such a way, the present control information and the past control information undergo the convolutional computation, and the resultant control information is assigned to one symbol, so that a more effective restricted condition can be applied and thus, a higher error correction capacity can be applied.

Furthermore, in the aforementioned embodiment, the present invention is applied to the cellular radiocommunication system 1 for controlling the transmitting power. However, the present invention is not limited thereto but the present invention can be widely applied to other systems, such as a control system which performs a control corresponding to control information by transmitting transmission symbols to which the control information is assigned from a transmitting side and receiving the transmission symbols at a receiving side.

According to the present invention as described above, the present control information and the past control information are formed into one pair to be assigned to one transmission symbol, and then a restricted condition is applied to the transmission symbol. Therefore, an error correcting capacity is added to the transmission symbol and thus, the control information can be efficiently transmitted.

Further, at the receiving side, a symbol of which the branch metric sum is the minimum is chosen as a received symbol, so that the symbol can be correctly decoded for an accurate control. Thus, the transmission accuracy of the control information can be improved.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A control information assigning method for a control system for performing a prescribed control corresponding to control information, comprising the steps of:
   transmitting symbols to which said control information is assigned from a transmitting side, said control information being encoded independently from said symbols;
   receiving said symbols at a receiving side, wherein said control information is used for determining a transmission power when said receiving side transmits symbols out; and
   forming at said receiving side present control information and past control information into a pair to be assigned to one symbol of said symbols to be transmitted out, so that a prescribed restricted condition is applied to said one symbol to be transmitted out.

2. The control information assigning method according to claim 1, comprising the further steps of:
   performing a convolutional computation based on said present control information and said past control information; and
   forming control information obtained by the convolutional computation into a second pair to be assigned to one of said symbols, so that a restricted condition is added to said symbol.

3. The control information assigning method according to claim 1, further comprising the step of,
   when assuming that said symbols are symbols in four phase modulation symbols, assigning said present control information and said past control information, which are formed into the first pair and which have contents opposite to each other, to a symbol of which a Euclid distance is a maximum, out of said symbols in said four phase modulation.

4. A control method for a control system for performing a prescribed control corresponding to a controlled variable, comprising the steps of:
   transmitting symbols to which said controlled variable is assigned from a transmitting side;
   receiving the symbols at a receiving side; and
   on the receiving side,
      storing, when one of said symbols to which a pair of a present controlled variable and a past controlled variable is assigned is transmitted, a cumulative controlled variable from an initial state to each symbol,
      choosing one of said symbols of which a branch metric sum is a minimum, out of said symbols received as a received symbol, and
      performing said control based on said cumulative controlled variable of the chose symbol.

5. The control method according to claim 4, further comprising the steps of:
   initially using several symbols to stabilize a decoding algorithm; and
   performing said control based on said cumulative controlled variable of the symbols subsequent to said initially using said several symbols.

6. The control method according to claim 4, further comprising the steps of:
   on the transmitting side, inserting a known symbol into said symbols for several symbols to transmit said symbols; and
   on the receiving side, bringing a decoding algorithm into convergence by said known symbol.

7. A transmitting method for a communication system for controlling transmitting power of a local station corresponding to control information, comprising the steps of:
   transmitting symbols to which said control information for controlling the transmitting power is assigned from a transmitting side, said control information being encoded independently from said symbols;
   receiving said symbols at a receiving side, wherein said control information is used for determining a transmission power when said receiving side transmits symbols out; and
   forming at said receiving side present control information and past control information into a pair to be assigned to one symbol of said symbols to be transmitted out, so that a prescribed restricted condition is applied to said one symbol to be transmitted out and said one symbol, to which the prescribed restricted condition is applied, is transmitted.

8. The transmitting method according to claim 7, further comprising the steps of:
   performing a convolutional computation based on said present control information and said past control information; and
   forming control information obtained by the convolutional computation into a second pair to be assigned to said symbol, so that a further restricted condition is added to said symbol.

9. The transmitting method according to claim 7, further comprising the step of,
   when assuming that said symbols are symbols in four phase modulation, assigning said present control information and said past control information, which are formed into the first pair and which have contents opposite to each other, to a symbol of which a Euclid distance is a maximum, out of said symbols in said four phase modulation.

10. A receiving method for a communication system for controlling transmitting power of a local station according to a controlled variable, comprising the steps of:
    transmitting symbols to which said controlled variable for controlling the transmitting power is assigned from a transmitting side;
    receiving said symbols at a receiving side; and,
    when one of said symbols to which a pair of a present controlled variable and a past controlled variable is assigned is transmitted,
       storing, for each symbol, a cumulative controlled variable for determining a change in the transmitting power from an initial state to a state of each symbol,
       choosing one of said received symbols of which a branch metric sum is a minimum as a received symbol, and
       controlling the transmitting power of the local station based on said cumulative controlled variable of the chosen symbol.

11. The receiving method according to claim 10, further comprising the steps of:
    initially using several symbols to stabilize a decoding algorithm; and
    performing said control based on said cumulative controlled variable of the symbols subsequent to said initially using said several symbols.

12. The receiving method according to claim 10, further comprising the steps of:
    inserting, on said transmitting side, a known symbol into said symbols for several symbols to transmit them; and
    on said receiving side, bringing a decoding algorithm into convergence by said known symbol.

13. The receiving method according to claim 10, wherein
    a signal-to-interference wave power ratio is reflected on said received symbol indicating a reliability of a transmission path.

14. A transmitter for a communication system for controlling transmitting power of a local station based on control information by transmitting symbols to which said control information for controlling the transmitting power is assigned from a transmitting side, wherein said control information is encoded independently from said symbols, and receiving said symbols at a receiving side, wherein said control information is used for determining a transmission power when said receiving side transmits symbols out, said transmitter comprising:
    symbol forming means for forming at said receiving side a present control information and a past control information into a pair and for assigning the pair to one symbol of said symbols to be transmitted out to form a symbol to which a prescribed restricted condition is added; and
    transmitting means for transmitting said symbol to be transmitted out to which said prescribed restricted condition is added.

15. The transmitter according to claim 14, wherein
    said symbol forming means performs a convolutional computation based on said present control information and said past control information and forms the control information obtained by the convolution computation into a second pair to assign the second pair to said symbol, in order to form said symbol to which said restricted condition is added.

16. The transmitter according to claim 14, wherein
    said symbol forming means, when assuming said symbol is symbols in four phase modulation, said present control information and said past control information which are formed into the first pair and of which contents are opposite to each other, are assigned to a symbol of which a Euclid distance is a maximum, out of said symbols in said four phase modulation.

17. A receiver for a communication system in which a transmitting power of a local station is controlled based on a controlled variable by transmitting symbols to which said controlled variable for controlling the transmitting power is assigned from a transmitting side and receiving said symbols at a receiving side, said receiver comprising:
    controlling means, when one of said symbols to which a pair of a present controlled variable and a past controlled variable is assigned is transmitted, for storing a cumulative controlled variable form an initial state to a state of each symbol, for choosing one of said symbols received of which a branch metric sum is a minimum as a received symbol, and for forming a transmitting power control signal base on said cumulative controlled variable of the chosen symbol; and variable gain means for setting the transmitting power of the local station to a desired value based on said transmitting power control signal.

18. The receiver according to claim 17, wherein said controlling means initially uses several symbols to stabilize a decoding algorithm and controls the transmitting power of the local station based on said cumulative controlled variable of the symbols subsequent to said several symbols used initially.

19. The receiver according to claim 17, wherein said controlling means brings a decoding algorithm into convergence based on a known symbol inserted into each of said symbols.

20. The receiver according to claim 17, wherein said controlling means reflects a signal-to-interference wave power ratio on said received symbol indicating a reliability of a transmission path.

21. A control information assigning method for a control system for performing a prescribed control corresponding to control information, comprising the steps of:

transmitting first symbols with control information from a first station;

receiving said first symbols with said control information at a second station, said control information being used to control a transmission power at said second station; and, forming at said second station present control information and past control information as a pair to be assigned to second symbols to be transmitted from said second station to said first station, so that a prescribed restricted condition is applied to said second symbols.

22. A control method for a control system for performing a prescribed control corresponding to a control value, comprising the steps of:

transmitting first symbols with a pair of present and past control values from a first station;

receiving said first symbols and said pair of present and past control values at a second station;

calculating a cumulative control value from an initial state to a state of each symbol based on said present and past control values; and, performing a transmission power control in response to said cumulative control value when said second station transmits second symbols to said first station.

23. A communication station for a communication system for controlling a transmission power based on control information, comprising:

a generator configured to generate present control information and past control information;

an encoder configured to form said present control information and said past control information as a pair;

a multiplexer configured to insert said pair into an information symbol to generate a multiplexed symbol; and, a transmitter configured to transmit said multiplexed symbol.

24. A communication station for a communication system for controlling a transmission power based on control information, comprising:

a receiver configured to receive an information symbol and a control information symbol, said control information symbol including a control value;

a memory configured to store a cumulative control value from an initial state to a state of each symbol based on said control value included in said control information symbol;

an amplifier configured to set said transmission power to a desired value in response to said cumulative control value; and, a transmitter configured to transmit symbols with said desired value of said transmission power.

* * * * *